United States Patent
Ko et al.

(10) Patent No.: US 7,091,766 B2
(45) Date of Patent: Aug. 15, 2006

(54) RETENTION REGISTER FOR SYSTEM-TRANSPARENT STATE RETENTION

(75) Inventors: Uming Ko, Plano, TX (US); David B. Scott, Plano, TX (US); Sumanth Gururajarao, Dallas, TX (US); Hugh Mair, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 17 days.

(21) Appl. No.: 10/616,207

(22) Filed: Jul. 3, 2003

(65) Prior Publication Data

US 2004/0008071 A1    Jan. 15, 2004

Related U.S. Application Data (60) Provisional application No. 60/395,123, filed on Jul. 11, 2002, provisional application No. 60/405,902, filed on Aug. 26, 2002, provisional application No. 60/437,079, filed on Dec. 30, 2002, provisional application No. 60/437,061, filed on Dec. 30, 2002.

(51) Int. Cl.
*H03K 3/12* (2006.01)
*H03K 3/37* (2006.01)
*H03K 3/286* (2006.01)
*H03K 3/356* (2006.01)

(52) U.S. Cl. ................. 327/218; 327/206; 327/208
(58) Field of Classification Search ............... 327/202, 327/203, 206–208, 210–212, 218
See application file for complete search history.

(56) References Cited

U.S. PATENT DOCUMENTS

| | | | |
|---|---|---|---|
| 6,304,122 B1* | 10/2001 | Gregor et al. ............ | 327/202 |
| 6,493,257 B1* | 12/2002 | Coughlin et al. ......... | 365/156 |
| 6,621,306 B1* | 9/2003 | Ooishi et al. ............. | 326/119 |
| 6,639,827 B1 | 10/2003 | Clark et al. .............. | 365/154 |
| 2002/0114377 A1* | 8/2002 | Schmidl et al. .......... | 375/132 |
| 2003/0188241 A1* | 10/2003 | Zyuban et al. ........... | 714/726 |
| 2003/0218231 A1* | 11/2003 | Sani et al. ................ | 257/500 |

OTHER PUBLICATIONS

"Retention Register with Normal Functionality Independent of Retention Power Supply", U.S. Appl. No. 10/613,271, Filed on Jul. 3, 2003.

(Continued)

*Primary Examiner*—Quan Tra
(74) *Attorney, Agent, or Firm*—Ronald O. Neerings; Wade James Brady, III; Frederick J. Telecky, Jr.

(57) ABSTRACT

State retention registers for use in low-power standby modes of digital IC operation are provided, wherein: a differential circuit (M1–M3; M1–M4) is used to load the shadow latch from the normal functional latch; the signal (REST, RESTZ) used to restore data from the shadow latch to the normal functional latch is a "don't care" signal while the shadow latch is retaining the data during low-power standby mode; retained data from the shadow latch is restored to the normal functional latch via a transistor gate connected to a node (N10) of the shadow latch where the retained data is provided; a power supply (VDD) other than the shadow latch's power supply (VRETAIN) powers the data restore operation; and the normal functional latch is operable independently of the operational states of the high $V_t$ transistors (M1, M2, M5 and M6; M3, M4, M5 and M6) used to implement the state retention functionality. In addition, an isolation apparatus is provided to retain an output of a logic module while the logic module is powered-down.

28 Claims, 11 Drawing Sheets

OTHER PUBLICATIONS

S. Shigematsu, et al., "A 1-V High-Speed MTCMOS Circuit Scheme for Power-Down Application Circuits," *IEEE Journal of Solid State Circuits*, vol. 32, No. 6, pp. 861-869, Jun. 1997.

* cited by examiner

RETENTION REGISTER FOR SYSTEM-TRANSPARENT STATE RETENTION

This application claims the priority under 35 U.S.C. 119(e)1 of copending U.S. Provisional Application No's. 60/395,123 filed on Jul. 11, 2002, 60/405,902 filed on Aug. 26, 2002, 60/437,079 filed Dec. 30, 2002, and 60/437,061 filed on Dec. 30, 2002, all of which are incorporated herein by reference.

FIELD OF THE INVENTION

The invention relates generally to digital integrated circuits and, more particularly, to reducing leakage current in power-saving standby modes of digital integrated circuit operation.

BACKGROUND OF THE INVENTION

The demand for higher clock-rates and lower power supply voltages in digital integrated circuits such as CMOS circuits results in rapidly increasing levels of standby leakage current (i.e., the current consumed by a CMOS circuit when the clock is not active). As an example, multi-million gate I.C.s operating in the Gigahertz region with supply voltages below 1.5V can have standby leakage of 100 mA or higher. This level of leakage current represents a significant problem for portable (battery operated) applications. This problem is conventionally addressed by introducing products that feature state-retentive, low-leakage standby modes.

Most conventional state retention schemes collapse the power supplies partially or entirely while maintaining the state of all the register elements. Upon restoration of the power, all circuit nodes return to their previous state since all nodes can be derived directly from the state of the register elements.

In conventional power-down applications, power supply to circuits can be turned off in order to reduce the standby power consumption. The state retention flip-flops that store the status of operation of the circuit need to store the data in latches with low leakage current during power-down phase. The retention latch (called a shadow latch hence forth) is formed with thick-oxide (low leakage) transistors and is powered by a separate permanent power supply to retain data in power-down or retention mode. Some disadvantages of such a scheme are: the additional circuitry required for such a shadow latch implementation is magnified at chip level when a large number of retention flip-flops are required; generation of additional control signals required to drive the flip-flop in and out of retention mode not only increase the flip-flop area, but also pose routing problems at block level; and additional shadow latch and control circuitry can load the speed-critical path of the flip-flop worsening the propagation delay of the flip-flop.

As mentioned above, some conventional approaches use retention registers (including shadow latches) to retain state while lowering the device leakage. One such scheme has two supplies, a permanent supply for retention and a virtual supply for conventional logic power. Low $V_t$ (leaky) devices are powered by the virtual supply, while High-$V_t$ (low leakage) devices are used for retention and powered from the permanent supply. This architecture has limitations. Both supplies must be present for normal operation. This introduces a physical design overhead of routing an additional power rail to all the registers. Also, minimum operating voltage is limited by the High-$V_t$ devices, effectively prohibiting conventional Vbox-min testing.

It is desirable in view of the foregoing to provide state retention registers which avoid the aforementioned disadvantages of conventional approaches. The various disadvantages of the conventional approaches can be avoided by various exemplary embodiments of the present invention, wherein: a differential circuit is used to load the shadow latch from the normal functional latch; the signal used to restore data from the shadow latch to the normal functional latch is a "don't care" signal while the shadow latch is retaining the data during low-power standby mode; retained data from the shadow latch is restored to the normal functional latch via a transistor gate connected to a node of the shadow latch where the retained data is provided; a power supply other than the shadow latch's power supply powers the data restore operation; and the normal functional latch is operable independently of the operational states of the high $V_t$ transistors used to implement the state retention functionality. In addition, an isolation apparatus is provided to retain an output of a logic module while the logic module is powered-down.

DETAILED DESCRIPTION

Figure 1:
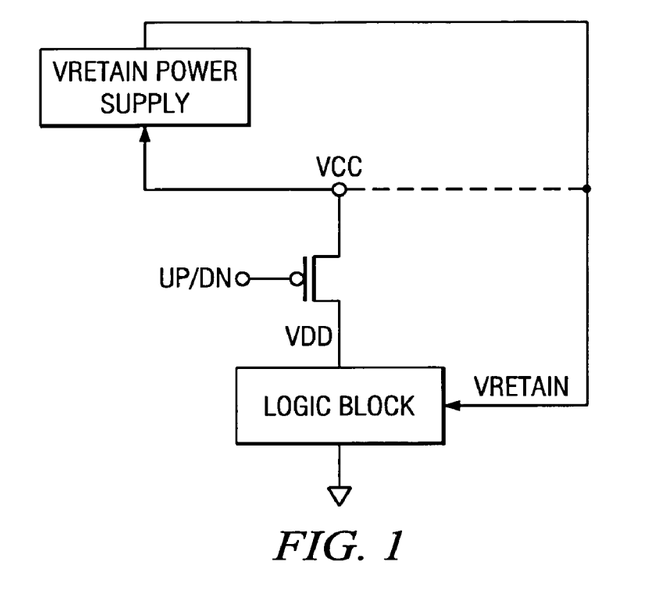
FIG. 1 diagrammatically illustrates an example of a logic block with a low-power, standby mode according to the invention.

FIG. 1 diagrammatically illustrates a power switching arrangement according to exemplary embodiments of the invention. As shown in FIG. 1, a suitable transistor is provided as a header switch for selectively (in response to the signal UP/DN) connecting and disconnecting the module level power supply VDD to and from the chip level (permanent) power supply VCC. The module level power supply VDD provides operating power for a logic module that includes state retention registers according to the invention. VDD is connected to VCC when UP/DN is activated, and is disconnected from VCC when UP/DN is inactivated.

Figure 2:
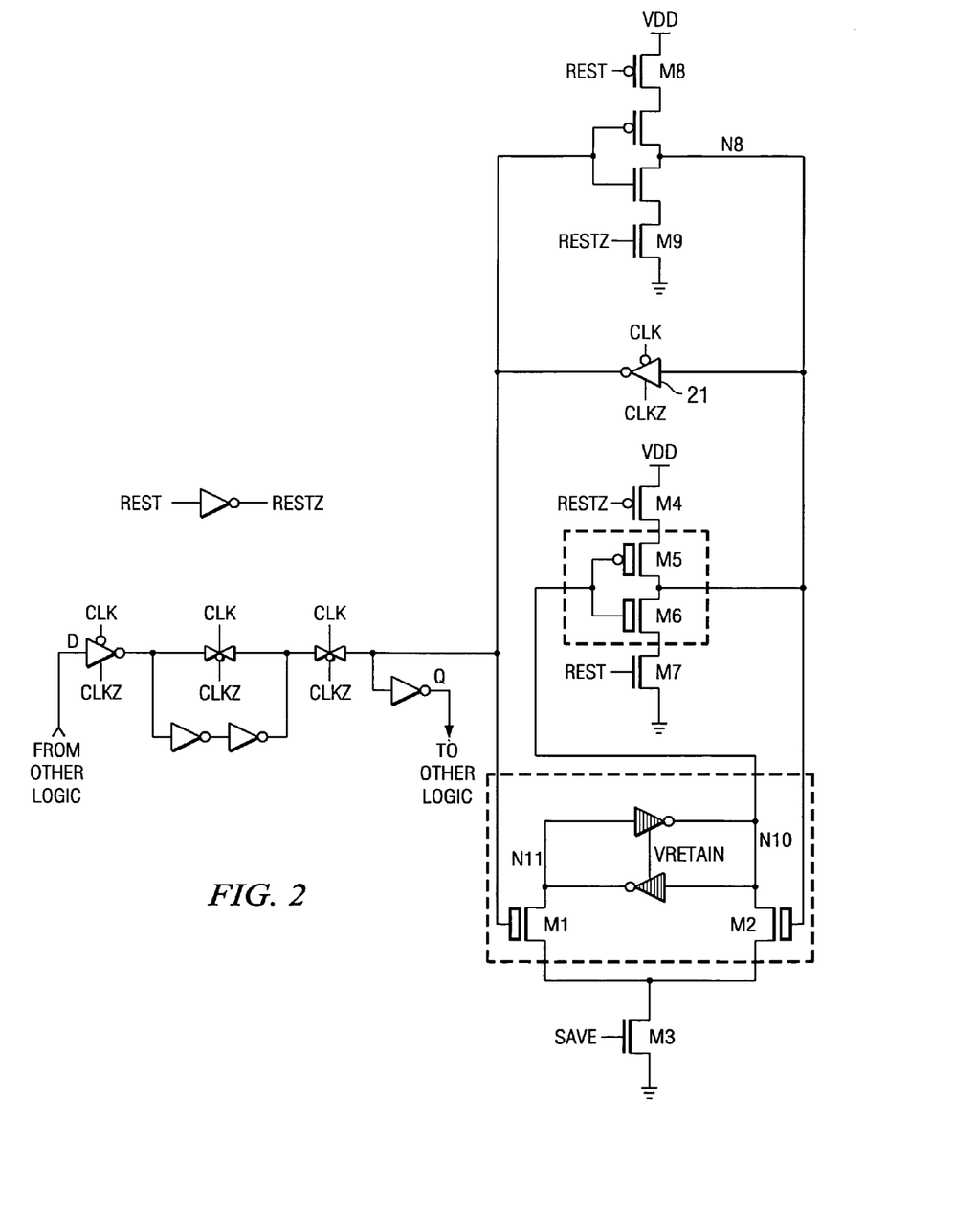
FIG. 2 diagrammatically illustrates exemplary embodiments of a flip-flop with state retention capability for use in a state retention register according to the invention.

FIG. 2 diagrammatically illustrates exemplary embodiments of a flip-flop with state retention capability for use in a state retention register according to the invention. The flip-flop of FIG. 2 is a multi-threshold CMOS (MTCMOS) flip-flop. This MTCMOS flip-flop includes normal core transistors which are used throughout the logic module and have a first gate oxide thickness, and also includes additional transistors having a thicker gate oxide (and correspondingly less leakage) than the normal core transistors. These thick gate oxide transistors are used to implement the state retention functionality of the flip-flop. The inverters connected back-to-back between the nodes N10 and N11 form a shadow latch for retaining data while power is removed from the normal functional (in this example, DQ) flip-flop circuitry. These inverters are formed with thick oxide (low leakage) transistors and are powered by a separate power supply VRETAIN, which is produced from the permanent power supply VCC (see also FIG. 1). As examples, VRETAIN can be produced by a VRETAIN power supply in some embodiments, and can be connected to VCC in other embodiments (shown by broken line in FIG. 1). The remainder of the FIG. 2 flip-flop is powered by the module level power supply VDD, which also powers the other logic of the logic module in which the state retention register resides. The entire flip-flop of FIG. 2, including the shadow latch, shares a common ground with the remainder of the associated logic module.

The complementary clock signals CLK and CLKZ are used in conventional fashion to operate the normal functional flip-flop circuitry. A save signal SAVE and restore signal REST (and its inverse RESTZ) are used to transition the FIG. 2 flip-flop between active and state retention modes of operation. During the active mode of operation (i.e., the normal functional flip-flop operation), the SAVE and REST signals are maintained at a logic zero level.

Prior to disconnecting VDD from VCC (see also FIG. 1), the data stored in the normal functional flip-flop circuit must be saved into the shadow latch. To accomplish this, the SAVE signal is strobed high, thereby activating a differential pull-down network at M1, M2 and M3. The pull-down network includes a pair of legs respectively connected to the complementary storage nodes at the input and output of the inverter 21 of the slave latch of the normal functional flip-flop. Depending on the logic state of the normal functional flip-flop, one of the legs of the differential pull-down network is activated to save the data into the shadow latch. The pull-down network can be designed to fight off the weak thick-oxide PMOS transistors of the shadow latch. In some embodiments, the transistors at M1, M2 and M3, and the transistors of the shadow latch are sized in order to ensure that the contents of the normal functional flip-flop are written into the shadow latch at the worst case process corner scenario. In the worst case scenario, the NMOS transistors M1 and M2 in the weak process corner need to fight off the associated PMOS transistors of the shadow latch in the strong process corner. The flip-flop of FIG. 2 can be made even more robust and reliable in some embodiments by designing for the aforementioned worst case process corner scenario at low temperature and low power supply voltage.

After the SAVE signal has been strobed and the data from the normal functional flip-flop has been stored into the shadow latch, the FIG. 2 flip-flop is ready to go into retention mode. The header switch of FIG. 1 is used to cut off VDD from VCC, so all nodes in the logic module that are powered by VDD decay to almost zero volts. However, the shadow latch is still powered by the separate power supply VRETAIN, so the data is retained in the shadow latch. In order to reduce the leakage current while the shadow latch is retaining data with the normal functional flip-flop circuitry powered-down, the shadow latch data storage nodes N10 and N11 should be isolated from the powered-down circuitry. This is accomplished by thick oxide transistors M1, M2, M5 and M6. The transistor stack at M4–M7 switchably connects the state retention storage node N10 to the node N8 of the normal functional flip-flop. The use of this transistor stack arrangement rather than, for example, a pass gate arrangement between node N11 and node N8, permits the storage node N10 to be connected to the gates of transistors M5 and M6, rather than having the storage node N11 connected to the sources (or drains) of a pass gate arrangement. Connection of node N1 to the gates of thick oxide transistors M5 and M6 advantageously reduces the possibility of current leakage from the shadow latch.

The complementary signals REST and RESTZ are used to restore the data from the shadow latch to the normal functional flip-flop. As VDD is re-connected to VCC (see also FIG. 1), the signal REST is driven to a logic 1 voltage. This activates thin oxide transistors M4 and M7 to power the inverter at M5–M6, which creates a read-back path from the shadow latch to the slave latch of the normal functional flip-flop for restoring the retained data. Also, when the signal REST is driven to a logic 1 voltage, the thin oxide transistors at M8 and M9 disable the feedback path of the slave latch of the normal functional flip-flop. Upon re-connection of VDD to VCC, only the shadow latch drives node N8, via the inverter at M4–M7. This ensures that the node N8 is restored to the voltage that was present there prior to disconnecting VDD from VCC. After the shadow latch has driven node N8 to its previous voltage, VDD is re-connected to VCC, after which the REST signal is returned to logic zero. At this point, the shadow latch is isolated from the normal functional flip-flop portion of FIG. 2, which is now ready to resume its normal functional DQ flip-flop operation.

Figure 3:
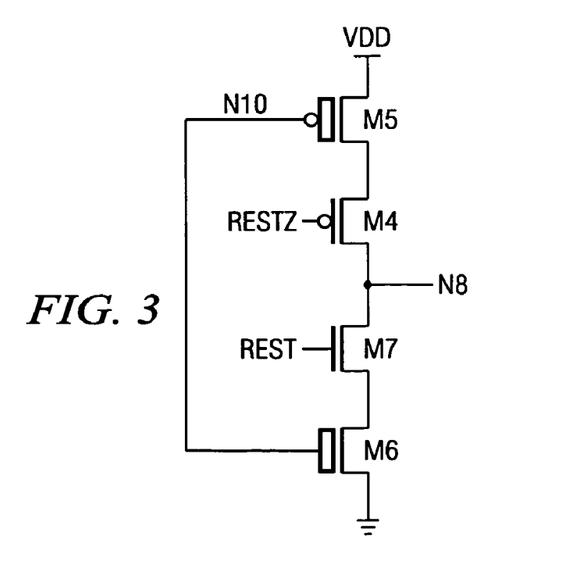
FIG. 3 diagrammatically illustrates further exemplary embodiments of a flip-flop with state retention capability for use in a state retention register according to the invention.

FIG. 3 diagrammatically illustrates pertinent portions of further exemplary embodiments of a state retention flip-flop arrangement for use in a state retention register according to the invention. FIG. 3 illustrates a flip-flop in which the thin oxide transistors M4 and M7 drive node N8, while thick oxide transistor M5 is connected between VDD and M4, and thick oxide transistor M6 is connected between M7 and ground. The gate signals controlling transistors M4–M7 are the same as illustrated in FIG. 2. The remainder of the state retention flip-flop can be otherwise identical to the structure shown in FIG. 2, and the arrangement of FIG. 3 operates in generally the same fashion described above with respect to FIG. 2.

Figure 8:
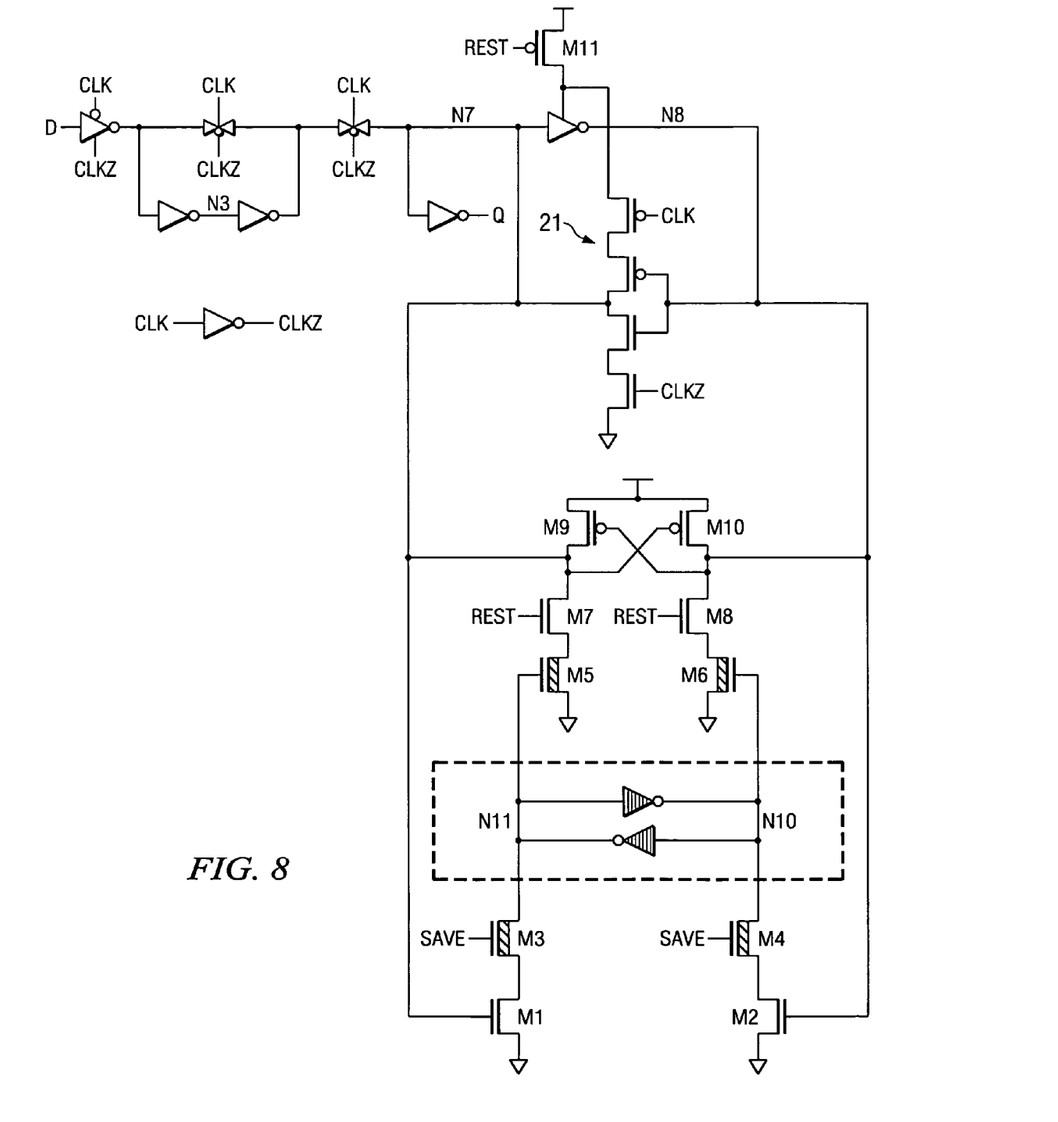
FIG. 8 diagrammatically illustrates further exemplary embodiments of a flip-flop with state retention capability for use in a state retention register according to the invention.

FIG. 8 diagrammatically illustrates further exemplary embodiments of a flip-flop with state retention capability for use in a state retention register according to the invention. In FIG. 8 (and in FIGS. 9 and 10 also), reference characters M1, M2, etc. from FIGS. 2 and 3 are re-used but, as can be seen from the drawings, they do not necessarily refer to the same types of transistors (NMOS or PMOS, thick or thin oxide) to which they refer in FIGS. 2 and 3. The flip-flop of FIG. 8 is a multi-threshold CMOS (MTCMOS) flip-flop. As in FIG. 2, the flip-flop of FIG. 8 includes normal core transistors which are used throughout the logic module and which have a first gate oxide thickness, and also includes additional transistors having a thicker gate oxide (and correspondingly less leakage) than the normal core transistors. These thick gate oxide transistors are used to implement the state retention functionality of the flip-flop. The inverters connected back-to-back between nodes N10 and N11 form a shadow latch for retaining data while power is removed from the normal functional flip-flop circuitry, which normal functional flip-flop circuitry can be, for example, generally the same as described above with respect to FIG. 2. The inverters between nodes N10 and N11 are formed with thick oxide (low leakage) transistors and are powered by the separate power supply VRETAIN described above with respect to FIGS. 1 and 2. The remainder of the FIG. 8 flip-flop is powered by the module level power supply VDD, which also powers the other logic of the logic module in which the state retention register resides. As in FIG. 2, the entire flip-flop of FIG. 8, including the shadow latch, shares a common ground with the remainder of the associated logic module. As in FIG. 2, the SAVE signal and the REST signal are used to transition the flip-flop between active and state retention modes of operation. During the active (normal) mode of operation, the SAVE and REST signals are maintained at a logic zero level.

As in FIG. 2, prior to disconnecting VDD from VCC (see also FIG. 1), the data stored in the normal functional flip-flop circuit must be saved into the shadow latch. To accomplish this, the SAVE signal is strobed high, thereby activating a differential pull-down network which includes transistors M1, M2, M3 and M4. The pull-down network includes a pair of legs respectively connected to the complementary storage nodes at the input and output of the inverter 21 of the slave latch of the normal functional flip-flop. Depending on the logic state of the normal functional flip-flop, one of the legs of the differential pull-down network is activated in response to the SAVE signal, in order to save the data from the normal functional flip-flop into the shadow latch. The pull-down network can be designed to fight off the weak thick-oxide PMOS transistors of the shadow latch. In some embodiments, the transistors M1–M4 and the transistors of the shadow latch are sized in order to ensure that the contents of the normal functional flip-flop are written into the shadow latch at the worst case process corner scenario. In the worst case scenario, the NMOS transistors M3 and M4 in the weak process corner need to fight off the PMOS transistors of the shadow latch in the strong process corner. The flip-flop of FIG. 8 can be made even more robust and reliable in some embodiments by designing for the worst case process corner scenario at low temperature and low power supply voltage.

After the SAVE signal has been strobed and the data from the normal functional flip-flop has been stored into the shadow latch, the FIG. 8 flip-flop is ready to go into retention mode. The header switch of FIG. 1 is used to cutoff VDD from VCC, so all modes in the logic module that are powered by VDD decay to almost 0 volts. However, the shadow latch is still powered by the separate power supply VRETAIN (not explicitly shown in FIG. 8), so the data is retained in the shadow latch. In order to reduce the leakage current while the shadow latch is retaining data with the normal functional flip-flop circuitry powered-down, the shadow latch data storage nodes N10 and N11 should be isolated from the powered-down circuitry. This is accomplished by thick oxide transistors M3, M4, M5 and M6. The transistors M5, M6, M7 and M8 form a differential pull-down structure which permits restoration of the data stored at nodes N10 and N11 to nodes N7 and N8, respectively. The use of this pull-down network rather than, for example, a pass gate arrangement between the nodes that N10, N11 and the nodes at N7, N8, permits the storage nodes at N10 and N11 to be connected to the gates of transistors M6 and M5, rather than having the storage nodes N10 and N11 connected to the sources (or drains) of a pass gate arrangement. Connection of nodes N10 and N11 to the gates of the thick oxide transistors M6 and M5, respectively, advantageously reduces the possibility of current leakage from the shadow latch.

The REST signal is used to restore the data from the shadow latch to the normal functional flip-flop. Before VDD is re-connected to VCC (see also FIG. 1), the signal REST is driven to a logic 1 voltage. This activates the pull-down network at M5–M8, and transistors M9 and M10 provide positive feedback to latch the data that has been retained in the shadow latch. This creates a read-back path from the shadow latch to the slave latch of the normal functional flip-flop for restoring the retained data. Also, when the signal REST is driven to a logic 1 voltage, the thin oxide transistor at M11 disables the feedback path of the slave latch of the normal functional flip-flop. Upon re-connection of VDD to VCC, only the shadow latch drives the nodes N7 and N8. This ensures that the nodes N7 and N8 are restored to the respective voltages that were present there prior to disconnecting VDD from VCC. After the shadow latch has driven the nodes N7 and N8 to their previous voltages, VDD is re-connected to VCC, after which the REST signal is returned to logic 0. At this point, the shadow latch is isolated from the normal functional flip-flop portion of FIG. 8, which is now ready to resume its normal functional DQ flip-flop operation.

Figure 9:
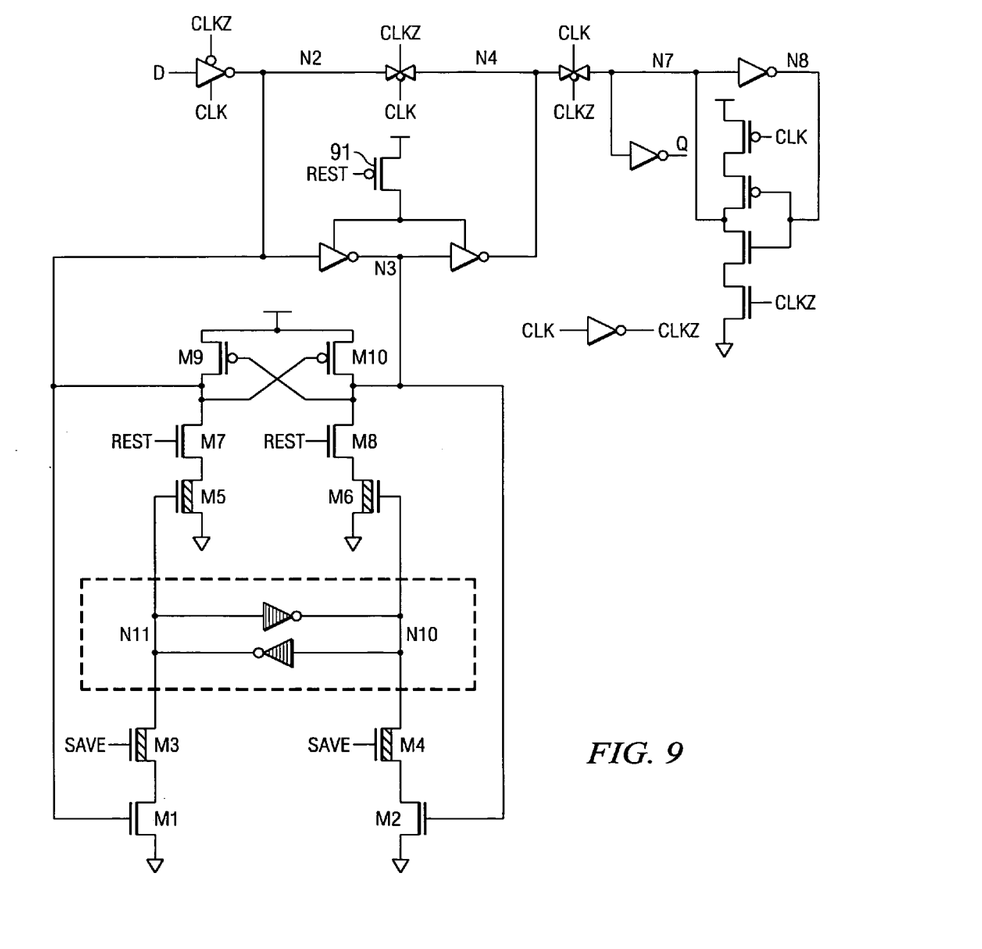
FIG. 9 diagrammatically illustrates further exemplary embodiments of a flip-flop with state retention capability for use in a state retention register according to the invention.

FIG. 9 diagrammatically illustrates further exemplary embodiments of a flip-flop with state retention capability for use in a state retention register according to the invention. In the arrangement of FIG. 9, the normal functional flip-flop circuitry is a negative edge-triggered design, rather than a positive edge-triggered design as illustrated in FIGS. 2 and 8. In this situation, the state retention circuitry is connected as shown to nodes N2 and N3 of the normal functional flip-flop circuitry in order to permit the save and restore operations to be performed with respect to the master latch of the normal functional flip-flop circuitry. That is, data from the master latch of the normal functional flip-flop circuitry can be saved into the shadow latch, and the data saved into the shadow latch can be restored to the master latch of the normal functional flip-flop circuitry. The state retention circuitry of FIG. 9, namely the shadow latch, the SAVE pull-down network M1–M4, and the RESTORE pull-down network M5–M10 can, in some embodiments, be the same as described above with respect to FIG. 8. In FIG. 9, when the REST signal is driven to a logic 1 voltage, a thin oxide transistor 91 disables the feedback path of the master latch of the normal functional flip-flop.

Figure 10:
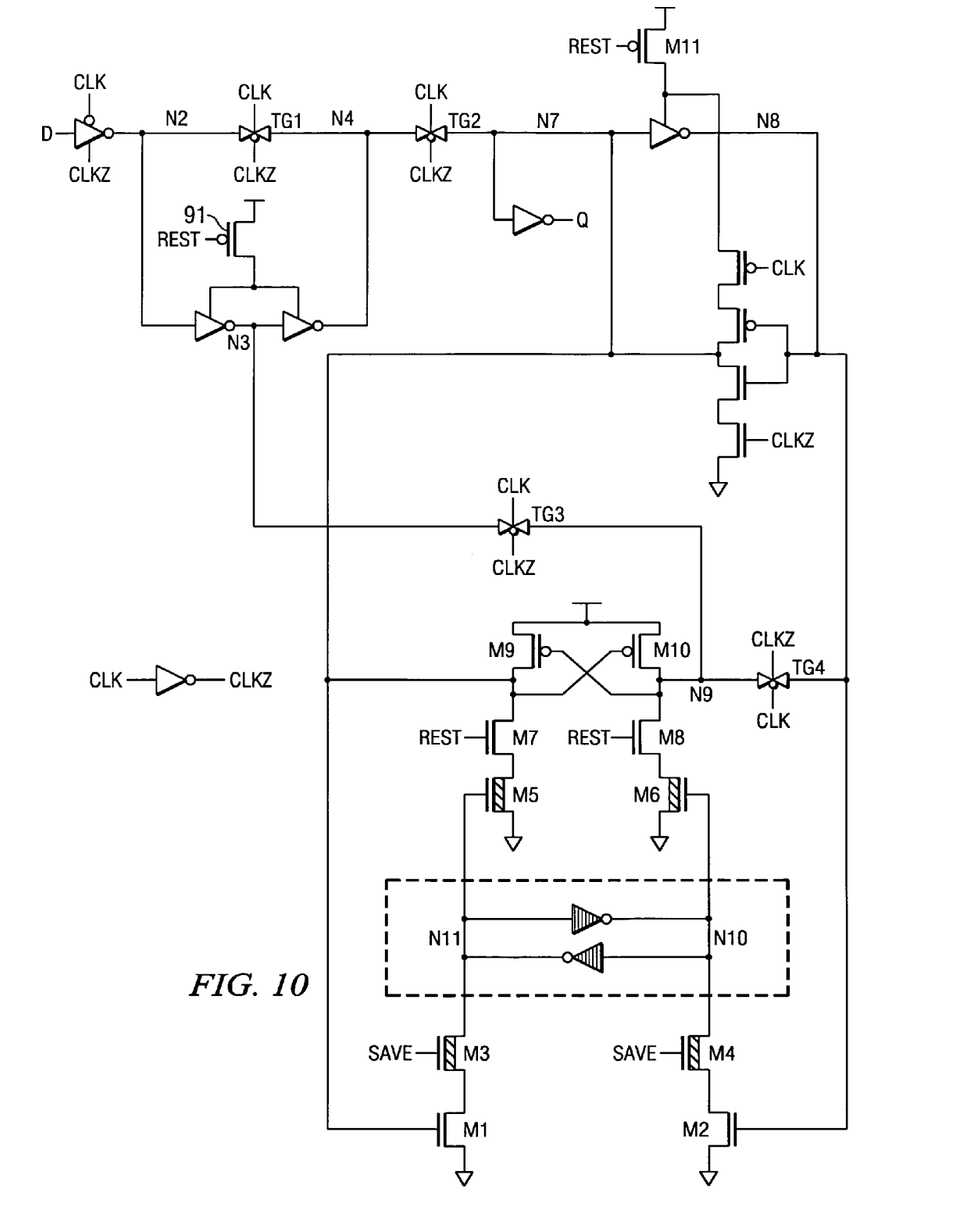
FIG. 10 diagrammatically illustrates further exemplary embodiments of a flip-flop with state retention capability for use in a state retention register according to the invention.

FIG. 10 diagrammatically illustrates further exemplary embodiments of a flip-flop with state retention capability for use in a state retention register according to the invention. The flip-flop of FIG. 10 employs a clock free retention scheme which permits the state retention function to be performed independently of the clock input CLK. This is useful for a flip-flop whose clock input is unknown upon power up, for example a flip-flop whose clock input is derived from the data output of another flip-flop. The flip-flop of FIG. 10 is generally similar to the flip-flop of FIG. 8, with the addition of transmission gate TG3 between node N3 of the master latch and node N9 defined at the connection point of series connected transistors M8 and M10, and transmission gate TG4 connected between node N9 and node N8 of the slave latch. The SAVE operation of the flip-flop of FIG. 10 can be the same as described above with respect to FIG. 8. When the REST signal is activated, node N7 is restored irrespective of the CLK state. Also, node N9 gets restored. Then, depending on whether CLK is high or low, node N9 drives either node N3 of the master latch (when CLK is high) or node N8 of the slave latch (when CLK is low). If CLK is low, then data is restored to node N8 to complete the loop in the slave latch. If CLK is high, then node N7 drives nodes N2 and N4 through transmission gates TG1 and TG2, and node N9 drives node N3 through transmission gate TG3. This completes the loop for the master latch.

In some exemplary embodiments, the transistors M9 and M10 each can have a 0.2 um width and a 0.4 um length. The flip-flop of FIG. 10 also includes the transistor 91 described above with respect to FIG. 9, so that activation of the REST signal disables the feedback path of the master latch.

Figure 4:
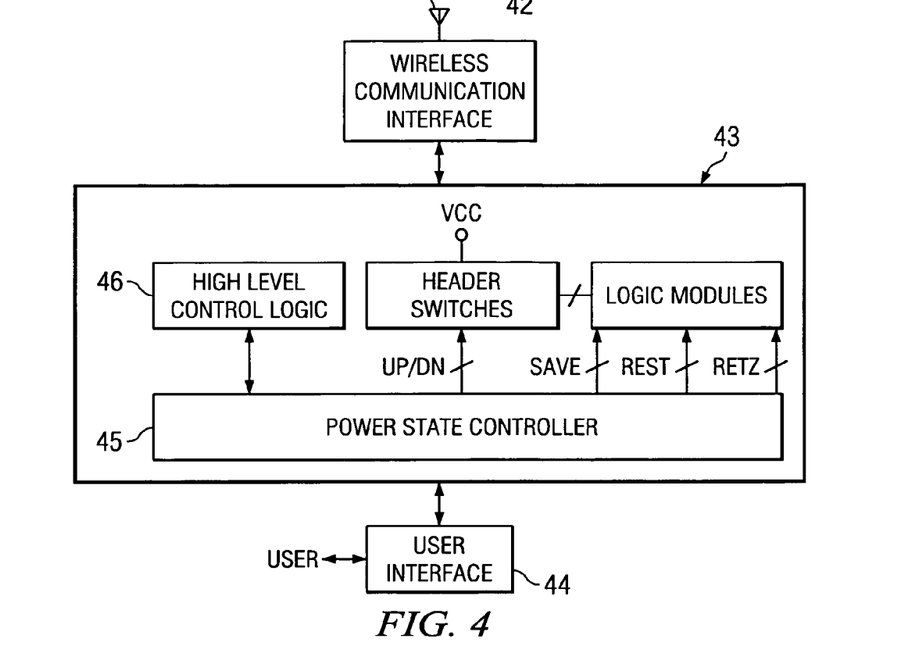
FIG. 4 diagrammatically illustrates pertinent portions of exemplary embodiments of a wireless communication apparatus according to the invention.

FIG. 4 diagrammatically illustrates pertinent portions of exemplary embodiments of a wireless communication apparatus according to the invention. The wireless communication apparatus of FIG. 4 includes an antenna structure 41 for permitting communication via an air interface 42. A data processing apparatus 43 can perform data processing operations related to the communications on air interface 42. A wireless communication interface can utilize conventional techniques to interface the data processing apparatus 43 to the antenna structure 41. A user interface 44 can use conventional techniques to interface the data processing apparatus 43 to a user of the wireless communication apparatus.

The data processing apparatus 43 includes a plurality of logic modules that include logic for performing data processing operations, and state retention registers for storing data associated with the data processing operations. These registers are constructed from corresponding pluralities of state retention flip-flops, for example the state retention flip-flops illustrated in FIGS. 2, 3 and 8–10. The data processing apparatus 43 further includes a power state controller 45 which, in some embodiments, utilizes state machines to provide appropriate control signals to the header switches and logic modules. As shown in FIG. 4, the power state controller provides control signals UP/DN to the respective header switches, and provides control signals REST, RETZ (described hereinbelow) and SAVE for distribution to each of the logic modules. The power state controller 45 activates these control signals appropriately to implement the exemplary operations described above with respect to FIGS. 2, 3 and 8–10.

Figure 5:
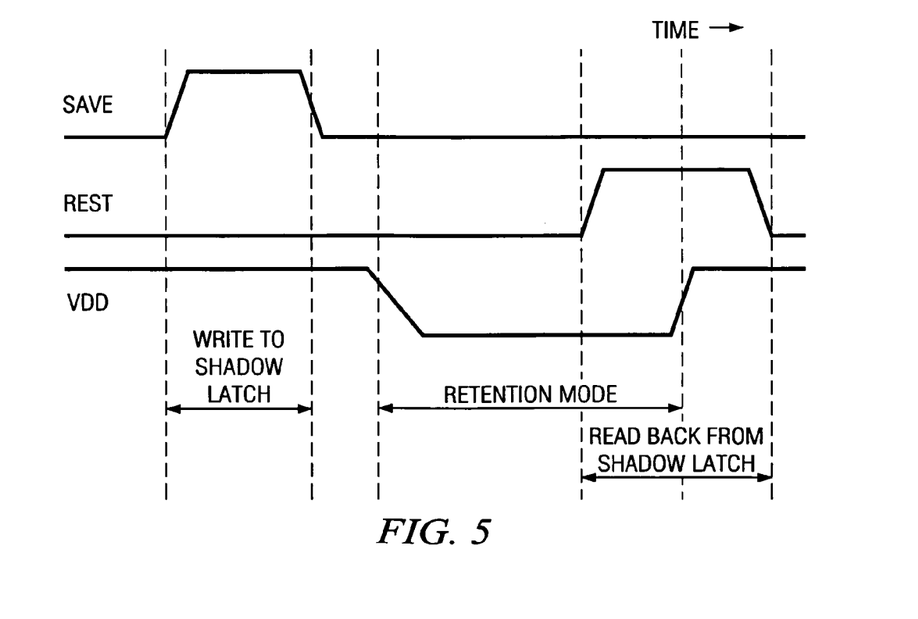
FIG. 5 is a timing diagram which illustrates exemplary operations of the power state controller of FIG. 4.

FIG. 5 is a timing diagram which illustrates the timing relationships of the control signals produced by the power state controller 45. Note that the VDD waveform of FIG. 5 generally timewise corresponds to activation (VDD on) and inactivation (VDD off) of the UP/DN signal of FIG. 4.

In some embodiments, high level control logic 46 orders the power state controller 45 to implement the low-power standby (state retention) mode of operation, whereupon the power state controller 45 can perform the exemplary signalling described above to implement the standby mode and then report this back to the high level control logic 46. The logic 46 and controller 45 can be powered by VRETAIN in some embodiments.

The wireless communication apparatus of FIG. 4 can be, for example, a cellular or other mobile telephone, a laptop computer, a personal digital assistant, etc. In some embodiments, the data processing apparatus 43 is provided as a single integrated circuit such as a microprocessor, microcontroller or digital signal processor.

Referring again to FIGS. 2 and 8–10, the SAVE signal must be guaranteed to be low during state retention. In some embodiments, SAVE is distributed using a buffer tree powered by the retention supply VRETAIN (also referred to herein as VRET). In these embodiments, the buffer tree that distributes SAVE to the state retention circuitry of a given logic module includes a plurality of buffer cells buried in a region of the integrated circuit where the associated logic module is located. These buffer cells are interconnected appropriately to route SAVE to the state retention circuitry. In some embodiments, each buffer cell is located directly under un-switched VDD metal, that is, a metal layer connected to VRET. Each buffer cell is connected to the un-switched VDD metal by a vertical stack of all metal and via layers. An example of this arrangement is illustrated generally in FIG. 6A.

Figure 6:
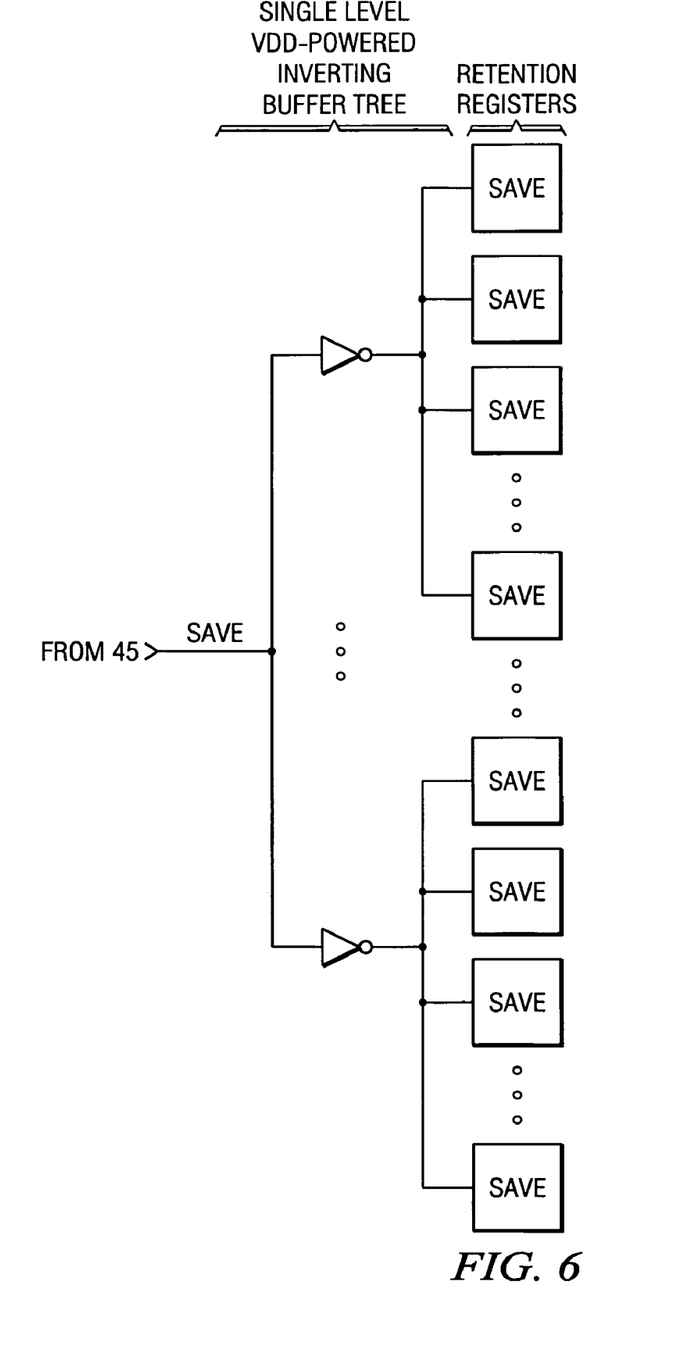
FIGS. 6, 6A and 7 diagrammatically illustrate exemplary schemes for distribution of control signals used by state retention circuitry according to the invention.
Figure 6A:
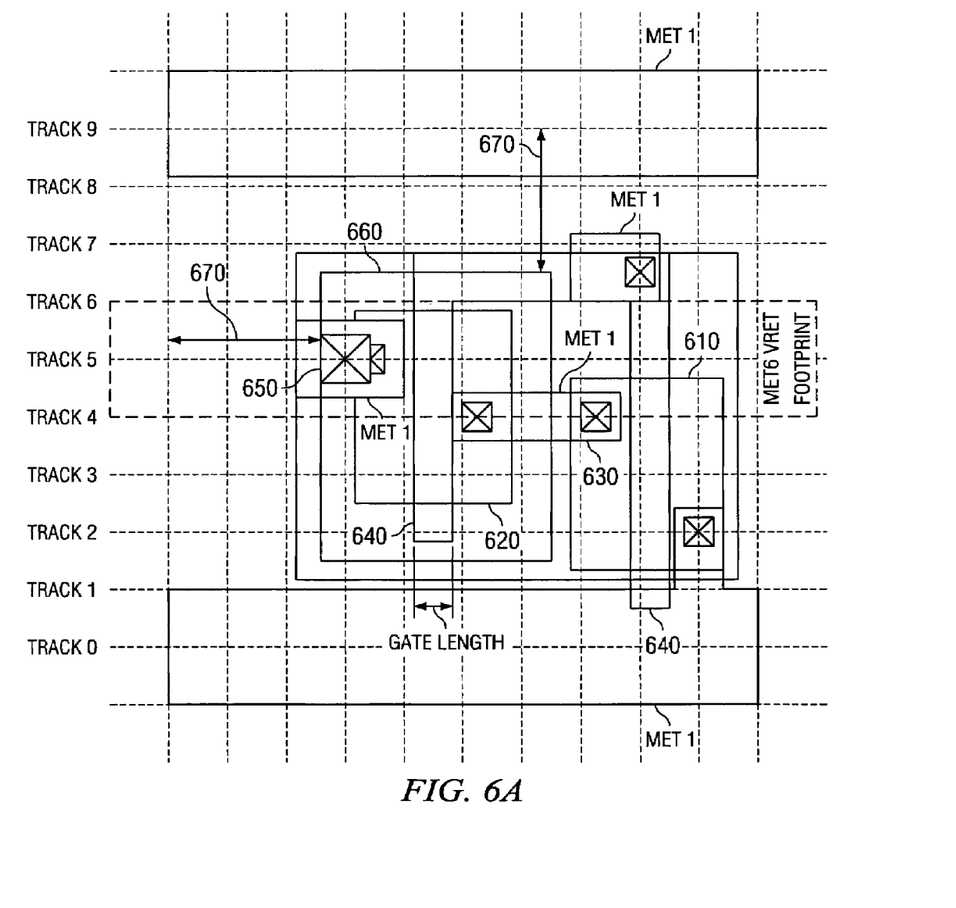

Referring now to FIG. 6A, an exemplary buffer cell includes thick-oxide transistors 610 and 620 interconnected at 630 and 640 to form an inverter. A metal layer MET6 connected to the retention voltage VRET is also connected to the transistor 620 (e.g., a PMOS transistor) by a vertical stack of all metal and via layers illustrated generally at 650. The vertical stack at 650 extends between the metal layer MET6 and a further metal layer MET1. The metal layer MET1 provides connectivity to the gates, sources and drains of the transistors 610 and 620. The vertical stack at 650 connects VRET to the transistor 620. The N-well 660 that contains the transistor 620 is electrically isolated from adjacent cells as illustrated generally at 670. In the arrangement of FIG. 6A, the N-well 660 observes a 570 nm spacing rule relative to the N-wells in adjacent buffer cells.

In FIG. 6A, the vertical stack 650 is routing track-centered on horizontal track 5. Further optimization of the horizontal alignment of vertically adjacent buffer cells is used in some embodiments to prevent long-run jogging in the routes of metal layers between layers MET1 and MET6. In some embodiments, minimum area rules with respect to the metal in the metal layers are observed in a manner that does not block more than one track in the preferred routing direction. This can reduce the impact of the vertical stack 650 on routability.

Figure 7:
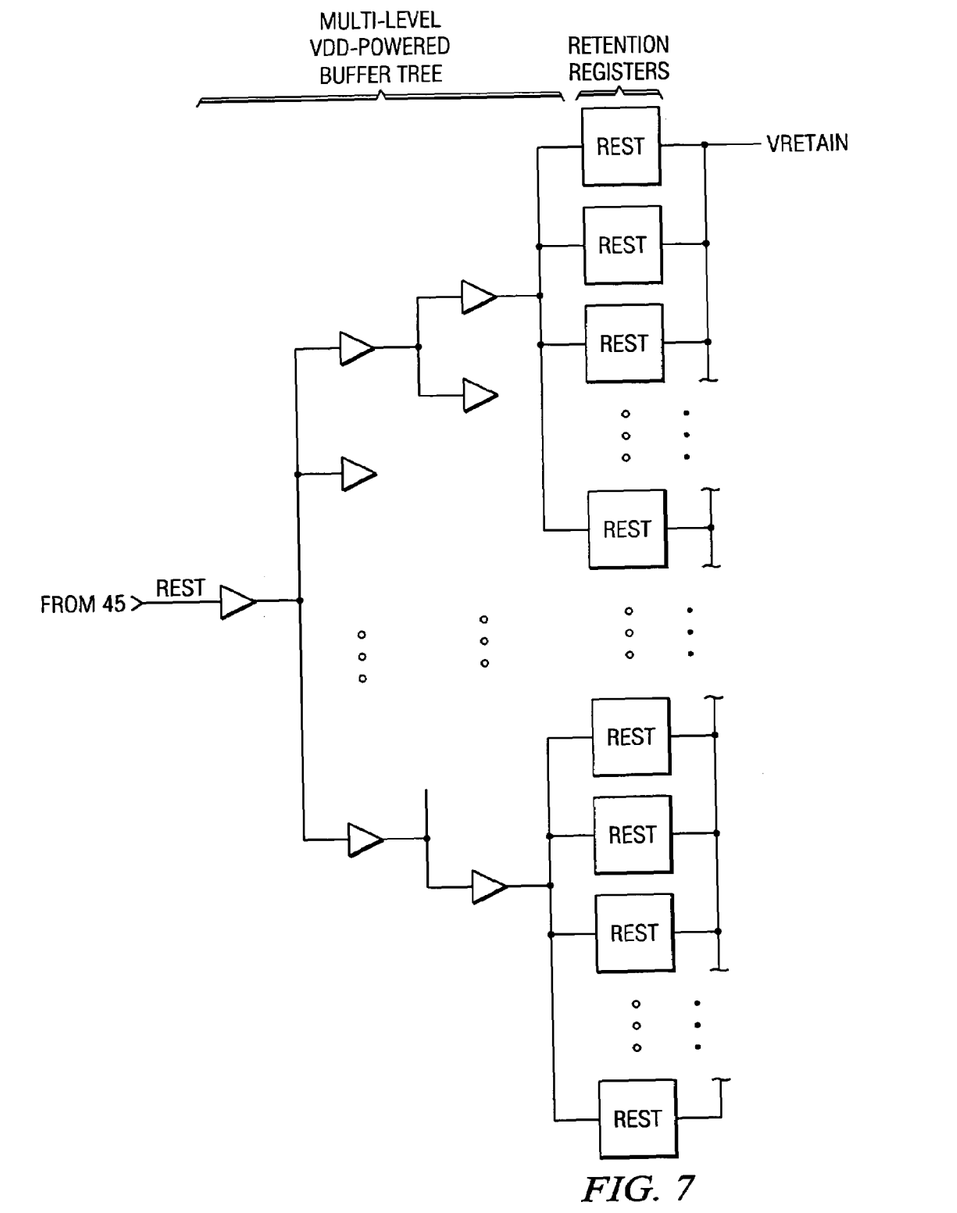

The buffer cell arrangement illustrated in FIG. 6A permits the SAVE signal and the RETZ signal (described hereinbelow) to be distributed throughout a given logic module by a buffer tree which has the same general structure as illustrated in FIG. 7, but which is powered by the retention power supply VRET.

Some embodiments use a VDD-powered buffer tree to distribute SAVE (and/or RETZ). In such embodiments, because VDD is removed from the logic module during state retention, only a single inverter can be placed between the power state controller 45 (see FIG. 4) and the state retention circuitry of the logic module. This is illustrated generally in FIG. 6. The power state controller 45 produces SAVE' or RET (respective inverses of SAVE and RETZ) for the FIG. 6 arrangement. If the signal SAVE' (or RET) is high, the SAVE (or RETZ) signal will remain low (as desired), even while the inverters of FIG. 6 are not receiving power.

The exemplary embodiments described above provide numerous advantages, some examples of which follow. Only 8 of the larger thick oxide transistors are needed for each state retention flip-flop: four transistors in the shadow latch; two transistors for writing to the shadow latch; and two transistors for reading the shadow latch. Only 2 thick oxide PMOS transistors are contained in separate N-wells, namely the PMOS transistors of the shadow latch inverters (see also FIGS. 2 and 8–10). Current leakage during state retention is reduced, because only thick oxide (low leakage) transistors remain biased during state retention.

The REST signal can be undefined during the state retention mode. This advantageously permits use of a fully active buffer tree (powered by VDD) to distribute the REST signal to the state retention registers, as illustrated generally in FIG. 7. The REST signal can therefore propagate very quickly (for example in a few nanoseconds) when VDD is re-connected to VCC, so the data from the shadow latch can be restored into the normal functional flip-flop very quickly, for example in around 100 nanoseconds. With a restoration time in the 100 nanoseconds range, a logic module can be placed into the low-power state retention mode at any time, because the restoration operation happens quickly enough to be undetectable by system software or hardware. Thus, the state retention mode is transparent to the data processing system.

Transistors M4 and M7 of FIGS. 2 and 3, and transistors M7–M10 of FIGS. 8–10 do not draw switching current from the VRETAIN power supply during state retention or during the transition from state retention to normal operation. This advantageously permits the VRETAIN power supply voltage to be routed as a conventional logic signal (e.g., to be routed to many registers in parallel as shown in FIG. 7), thus eliminating the need for a conventional power grid to distribute VRETAIN. If routed as a logic signal, the VRETAIN power supply can collapse when the SAVE signal is asserted, but sufficient time can be allowed for VRETAIN to return to its DC level before the SAVE signal is de-asserted. Although this increases the time required to perform a state save operation, the state save operation does not limit the system response time.

All of the thick oxide (high $V_t$, low leakage) transistors of FIGS. 2, 3 and 8–10 can be inoperable (i.e., at any level of conductance/resistance) without affecting the normal operation of the normal functional flip-flop. This advantageously permits conventional Vbox-min testing at low $V_t$ levels, even though operation of the high $V_t$ transistors is unpredictable at such low $V_t$ levels.

Referring again to FIG. 4, in some applications, it may be desirable to power-down one or more of the logic modules independently of the remaining logic modules, in order to reduce current consumption. In these situations, the output signal voltages of the powered-down logic module(s) should be maintained in order to ensure that any powered-up logic module that is driven by an output signal of a powered-down logic module will not be affected by the powering-down of the driving logic module(s).

Figure 11:
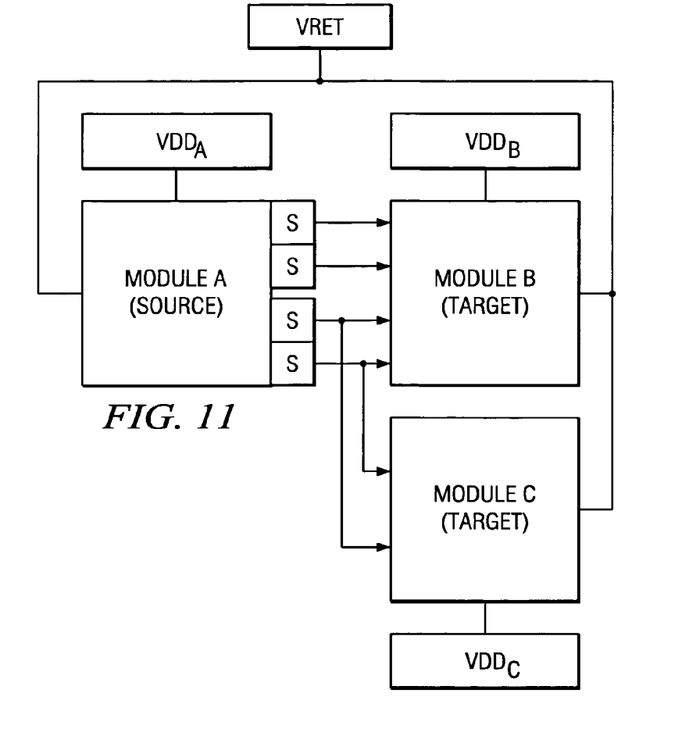
FIG. 11 diagrammatically illustrates a plurality of logic modules which can be selectively powered-down.

FIG. 11 diagrammatically illustrates the need to maintain output signals from a powered-down logic module. In FIG. 11, modules A, B and C are powered by respectively different power supplies, $VDD_A$, $VDD_B$ and $VDD_C$, respectively. VRET (also referred to hereinabove as VRETAIN) is the retention power supply, which is common to all three of the logic modules. If only module A will be powered-down (by removal of $VDD_A$), then the signal voltage levels at its outputs should be maintained in order to permit continued operation of modules B and C. As shown in FIG. 11, each output of module A can have associated therewith an apparatus S for maintaining the associated output signal voltage while module A is powered-down.

Figure 12:
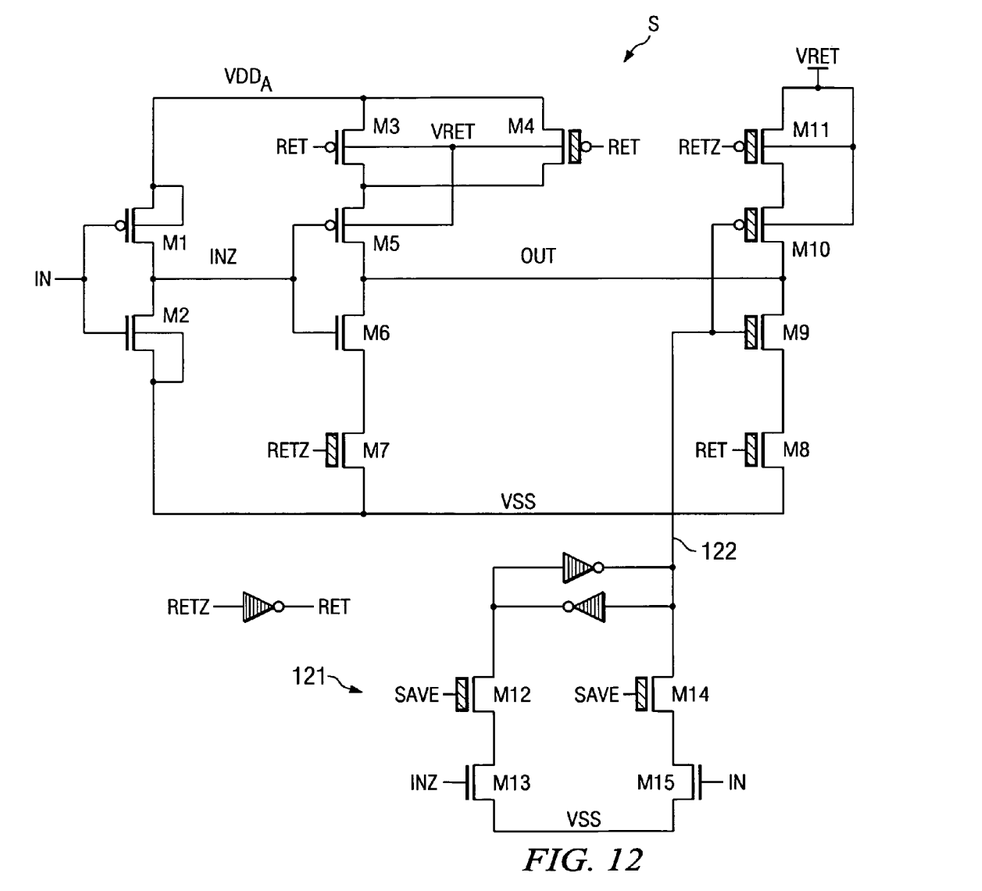
FIG. 12 diagrammatically illustrates exemplary embodiments of a retention apparatus for retaining an output of a logic module while the logic module is powered-down.

FIG. 12 diagrammatically illustrates exemplary embodiments of an apparatus S for maintaining an output voltage signal level of a logic module that has been powered-down (see module A of FIG. 11). In FIG. 12, reference characters M1, M2, etc. from FIGS. 2, 3 and 8–10 are re-used, but, as can be seen from the drawings, they do not necessarily refer to the same types of transistors (NMOS or PMOS, thick or thin oxide) to which they refer in FIGS. 2, 3 and 8–10. The input node IN of the apparatus of FIG. 12 can be connected, for example, to the Q output of any of the flip-flops in FIGS. 2, 3 and 8–10. During normal powered-up operation of the logic module A, the series-connected inverters M1, M2, and M5, M6 form a driver that buffers the signal from node IN to the output node OUT. This driver can be selectively disabled by using transistors M3, M4 and M7 to disconnect the second stage inverter M5, M6 from its power supply inputs, namely $VDD_A$ and ground (VSS). The shadow latch and differential pull-down network illustrated generally at 121 in FIG. 12 can be the same as the corresponding structure in FIGS. 8–10. As shown, the data inputs to the structure 121 are the signal at the input node IN of the first stage inverter M1, M2 and the signal at the output node INZ of the first stage inverter M1, M2. The SAVE signal of FIG. 12 can be the same as described above with respect to FIGS. 2, 3 and 8–10. The transistors of the shadow latch inverters and the transistors M12 and M14 of the pull down network are thick oxide transistors, and the transistors of the shadow latch inverters are powered by the retention power supply VRET.

The output node 122 of the shadow latch drives the input of an inverting driver stage M8–M11. In particular, transistors M9 and M10 form an inverter between node 122 and the OUT node. The transistors M8 and M11 provide the capability of selectively disabling the inverter M9, M10 by disconnecting it from its power supply inputs, namely VRET and ground. All of the transistors M8–M11 are thick oxide transistors.

During normal, powered-up operation of the logic module A, the signal RET is low and the complementary signal RETZ is high. Under these conditions, the parallel combination of transistors M3 and M4, together with transistor M7, provide a connection between the second stage inverter M5, M6 and its power supply inputs, namely $VDD_A$ and ground. During retention mode, when RET is high and RETZ is low to disable the second stage inverter, there may be some leakage through transistor M3. In order to reduce the impact of such leakage, the width-to-length (W/L) ratio of transistor M3 can be selected to be relatively small, for example, in a range from about 3 to about 10. Conversely, because leakage during retention mode is not a problem with respect to the thick oxide transistor M4 (or M7), the width-to-length ratio of M4 (and M7) can be relatively large. for example in a range from about 30 to over 100, in order to increase speed Transistor M3 has a lower $V_t$ than does transistor M4, thereby permitting normal operation of the arrangement of FIG. 12, even when $VDD_A$ is very low, for example, as low as 0.7 volts. Thus, the arrangement of FIG. 12 can be subjected to Vbox-min testing at low $V_t$ levels, even though operation of the high $V_t$ transistor M4 is unpredictable at low $V_t$ levels.

After the data signal defined at IN and INZ is latched into the shadow latch at 121 by strobing the SAVE signal high, the signal RETZ is taken low, in order to invoke the retention mode of operation. The strobing of SAVE also latches the data signal into an internal shadow latch within logic module A, for example, the shadow latch of one of the state retention flip-flops described above relative to FIGS. 2,3 and 8–10. With RETZ low and its complement RET high, the second stage inverter M5, M6 is disabled, and the output inverter driver M9, M10 is enabled, thereby providing the contents of the shadow latch at 121 to an input of another powered-up logic module, such as module B or module C of FIG. 11.

After the data signal from the logic module A is restored at node IN (by operation of the restore signal REST in the corresponding state retention flip-flop of module A), then the signal RETZ can be taken high again, thereby disabling the inverter M9, M10 and enabling the inverter M5, M6 to re-institute normal output operation of module A.

Figure 13:
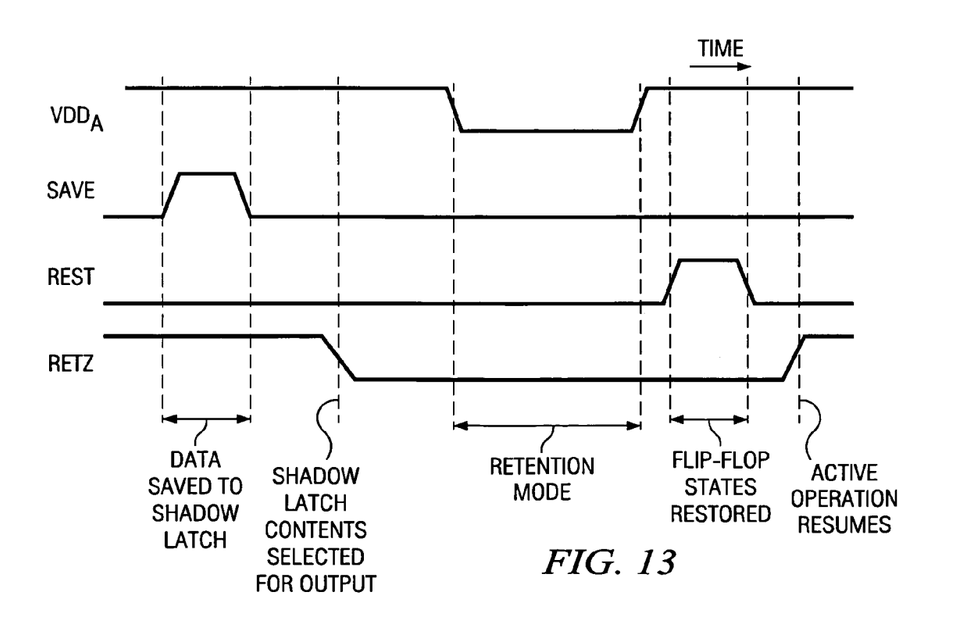
FIG. 13 is a timing diagram which illustrates further exemplary operations which can be performed by the power state controller of FIG. 4.

FIG. 13 is a timing diagram which illustrates exemplary operations (described above) that can be performed by the power state controller 45 of FIG. 4 in order to control operation of the apparatus of FIG. 12. In some embodiments, the SAVE signal and the restore signal REST can be produced and distributed in the same manner described above with respect to FIGS. 2–10, and RETZ can be produced and distributed in the same manner as SAVE. In the example of FIG. 13, the restore signal REST goes high after $VDD_A$ comes back up, whereas FIG. 5 illustrates the restore signal REST going high somewhat before VDD comes back up. This distinction is not operationally significant because, as discussed above with respect to FIG. 7, the restore signal REST is distributed within a given logic module by a VDD-powered buffer tree. So, even if the power state controller 45 of FIG. 4 drives the restore signal REST high before VDD comes back to the corresponding logic module, the restore signal REST will not become active within that logic module until VDD comes back up to power the buffer tree that distributes REST throughout the logic module.

Although exemplary embodiments of the invention are described above in detail, this does not limit the scope of the invention, which can be practiced in a variety of embodiments.

What is claimed is:

1. A data latch apparatus, comprising:
    a first latch including a plurality of transistors having respective gate oxides for latching a data signal;
    a second latch coupled to said first latch for retaining said data signal while said first latch is inoperative;
    a save device connected between said first and second latches for transferring said data signal from said first latch to said second latch, said save device including a first transistor having a gate and having a gate oxide that is thicker than said gate oxides of said plurality of transistors; and
    said first latch including a first node for providing said data signal to said save device, said gate connected to said first node.

2. The apparatus of claim 1, wherein said first latch has a second node for providing said data signal, said save device including a second transistor having a gate connected to said second node.

3. The apparatus of claim 2, wherein said first and second transistors are connected at a common node other than said first and second nodes.

4. The apparatus of claim 3, wherein said save device includes a third transistor connected to said common node.

5. The apparatus of claim 4, wherein said third transistor has a gate for receiving a control signal which indicates when to transfer said data signal from said first latch to said second latch.

6. The apparatus of claim 2, wherein said save device includes third and fourth transistors respectively connected to said first and second transistors.

7. The apparatus of claim 6, wherein said third and fourth transistors have respective gates for receiving a control signal which indicates when to transfer said data signal from said first latch to said second latch.

8. The apparatus of claim 6, wherein said first latch includes a first plurality of transistors, each transistor of said first plurality having a gate oxide, said third and fourth transistors having respective gate oxides which are thicker than said gate oxides of said first plurality of transistors.

9. The apparatus of claim 2, wherein said first latch includes an inverter having an input and an output, and wherein said first node is said inverter input and said second node is said inverter output.

10. The apparatus of claim 2, wherein said first latch includes a first plurality of transistors, each transistor of said first plurality having a gate oxide, said first and second transistors having respective gate oxides which are thicker than said gate oxides of said first plurality of transistors.

11. The apparatus of claim 1, wherein said second latch is for retaining said data signal while said first latch is inoperative due to removal of power therefrom.

12. A data processing apparatus, comprising:
    data processing logic for performing data processing operations;
    a plurality of registers coupled to said data processing logic for storing data associated with said data processing operations, each said register including a plurality of data latch structures; and
    each said data latch structure including a first latch including a first transistor having a first threshold voltage for latching a data signal, a second latch coupled to said first latch for retaining said data signal while said first latch is inoperative, and a restore device connected between said first and second latches, said restore device having an input transistor having a second threshold voltage greater in magnitude than said first threshold voltage for receiving a restore signal, said restore device responsive to said restore signal for transferring said data signal from said second latch to said first latch, said restore device further for isolating said second latch from said first latch independently of said restore signal while said first latch is inoperative.

13. The apparatus of claim 12, provided as one of a microprocessor, a microcontroller and a digital signal processor.

14. The apparatus of claim 12, including a distribution structure connected to said restore devices for distributing said restore signal to said restore devices, said distribution structure powered by a first power supply, and said second latch powered by a second power supply other than said first power supply.

15. A wireless communication apparatus, comprising:
    an antenna structure for permitting communication via an air interface;
    a digital data processor for performing digital data processing operations;
    a wireless communication interface coupled between said antenna structure and said digital data processor for interfacing between said antenna structure and said digital data processor; and
    said digital data processor including a plurality of data latch structures, each said data latch structure including a first latch including a first transistor having a first threshold voltage for latching a data signal, a second latch coupled to said first latch for retaining said data signal while said first latch is inoperative, and a restore device connected between said first and second latches, said restore device having an input transistor having a second threshold voltage greater in magnitude than said first threshold voltage for receiving a restore signal, said restore device responsive to said restore signal for transferring said data signal from said second latch to said first latch, said restore device further for isolating said second latch from said first latch independently of said restore signal while said first latch is inoperative.

16. The apparatus of claim 15, provided as one of a mobile telephone, a laptop computer and a personal digital assistant.

17. A data latch apparatus, comprising:
a first latch for latching a data signal;
a second latch coupled to said first latch for retaining said data signal while said first latch is inoperative;
a restore device connected between said first and second latches for transferring said data signal from said second latch to said first latch, said restore device further for isolating said second latch from said first latch while said first latch is inoperative; and
said second latch having a first node for providing said data signal to said restore device, said restore device including a first transistor and a second transistor having respective gates connected to said first node.

18. The apparatus of claim 17, wherein said first latch includes a plurality of transistors, each transistor of said plurality having a gate oxide, said first and second transistors having gate oxides which are thicker than said gate oxides of said plurality of transistors.

19. The apparatus of claim 18, wherein said restore device includes third and fourth transistors connected in series with said first and second transistors.

20. The apparatus of claim 19, wherein said third and fourth transistors each have a gate oxide that is thinner than said gate oxides of said first and second transistors.

21. The apparatus of claim 19, wherein said third and fourth transistors are connected at a common node other than said first node, and wherein said common node provides said data signal to said first latch.

22. The apparatus of claim 17, wherein said first latch includes a plurality of transistors, each transistor of said plurality having a gate oxide, said first transistor having a gate oxide that is thicker than said gate oxides of said plurality of transistors.

23. The apparatus of claim 17, wherein said second latch is for retaining said data signal while said first latch is inoperative due to removal of power therefrom.

24. The apparatus of claim 17, wherein said second latch has a second node for providing said data signal to said restore device, said restore device including a second transistor having a gate connected to said second node.

25. The apparatus of claim 24, wherein said first latch includes a plurality of transistors, each transistor of said plurality having a gate oxide, said first and second transistors having gate oxides which are thicker than said gate oxides of said plurality of transistors.

26. The apparatus of claim 25, wherein said restore device includes third and fourth transistors connected in series with said first and second transistors, respectively, each of said third and fourth transistors having a gate connected to said input.

27. The apparatus of claim 26, wherein said third and fourth transistors each have a gate oxide that is thinner than said gate oxides of said first and second transistors.

28. The apparatus of claim 26, wherein said restore device includes a fifth transistor connected in series with said first and third transistors and a sixth transistor connected in series with said second and fourth transistors, wherein said fifth transistor has a gate connected to said fourth transistor at a third node and said sixth transistor has a gate connected to said third transistor at a fourth node, and wherein said third and fourth nodes provide said data signal to said first latch.

* * * * *